United States Patent
Rodriguez et al.

(10) Patent No.: US 7,889,535 B2
(45) Date of Patent: Feb. 15, 2011

(54) F-SRAM MARGIN SCREEN

(75) Inventors: John A. Rodriguez, Dallas, TX (US); Hugh P. McAdams, McKinney, TX (US); Scott R. Summerfelt, Garland, TX (US); Steven Bartling, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 99 days.

(21) Appl. No.: 12/491,817

(22) Filed: Jun. 25, 2009

(65) Prior Publication Data

US 2010/0002488 A1     Jan. 7, 2010

Related U.S. Application Data

(60) Provisional application No. 61/077,395, filed on Jul. 1, 2008.

(51) Int. Cl.
*G11C 11/22* (2006.01)
(52) U.S. Cl. .................. 365/145; 365/149; 365/201; 365/226
(58) Field of Classification Search .......... 365/145, 365/149, 201, 226
See application file for complete search history.

(56) References Cited

U.S. PATENT DOCUMENTS

| 6,836,425 B2 * | 12/2004 | Kang et al. ............ 365/145 |
| 2010/0296329 A1 * | 11/2010 | Summerfelt et al. ...... 365/145 |

OTHER PUBLICATIONS

Shoichi Masui et al., "A Ferroelectric Memory-Based Secure Dynamically Programmable Gate Array," IEEE Journal of Solid-State Circuits; pp. 715-725; vol. 38, No. 5; May 2003. Fujitsu Laboratories, Ltd.; Akiruno, Japan.

Tohru Miwa et al., "NV-SRAM: A Nonvolatile SRAM with Backup Ferroelectric Capacitors," IEEE Journal of Solid-State Circuits; pp. 522-527; vol. 36, No. 3; Mar. 2001. System Devices and Fundamental Research, NEC Corporation; Kanagawa, Japan.

Tohru Miwa et al., "A 512 Kbit low-voltage NV-SRAM with the size of a conventional SRAM," Symposium on VLSI Circuits Digest of Technical Papers; pp. 129-132; 2001. Silicon Systems Research Laboratories, NEC Corporation. ULSI Device Development Division, NEC Corporation; Kanagawa, Japan.

* cited by examiner

*Primary Examiner*—Pho M Luu
(74) *Attorney, Agent, or Firm*—Rose Alyssa Keagy; Wade J. Brady, III; Frederick J. Telecky, Jr.

(57) ABSTRACT

A process of testing an integrated circuit containing a programmable data storage component containing at least two ferroelectric capacitors coupled to complementary state nodes that includes applying a disturb voltage prior to a recall operation. Also, a process of testing an integrated circuit containing a programmable data storage component containing at least two ferroelectric capacitors coupled to complementary state nodes that includes adjusting a disturb voltage and determining if a screening data value and a read data value meet a criterion for determining a limiting disturb voltage.

20 Claims, 5 Drawing Sheets

F-SRAM MARGIN SCREEN

CROSS-REFERENCE TO PROVISIONAL APPLICATION

This application claims the benefit of U.S. Provisional Application No. 61/077,395 filed Jul. 1, 2008, which is commonly assigned and incorporated herein by this reference.

FIELD OF THE INVENTION

This invention relates to the field of integrated circuits. More particularly, this invention relates to ferroelectric capacitors in integrated circuits.

DETAILED DESCRIPTION

Figure 1:
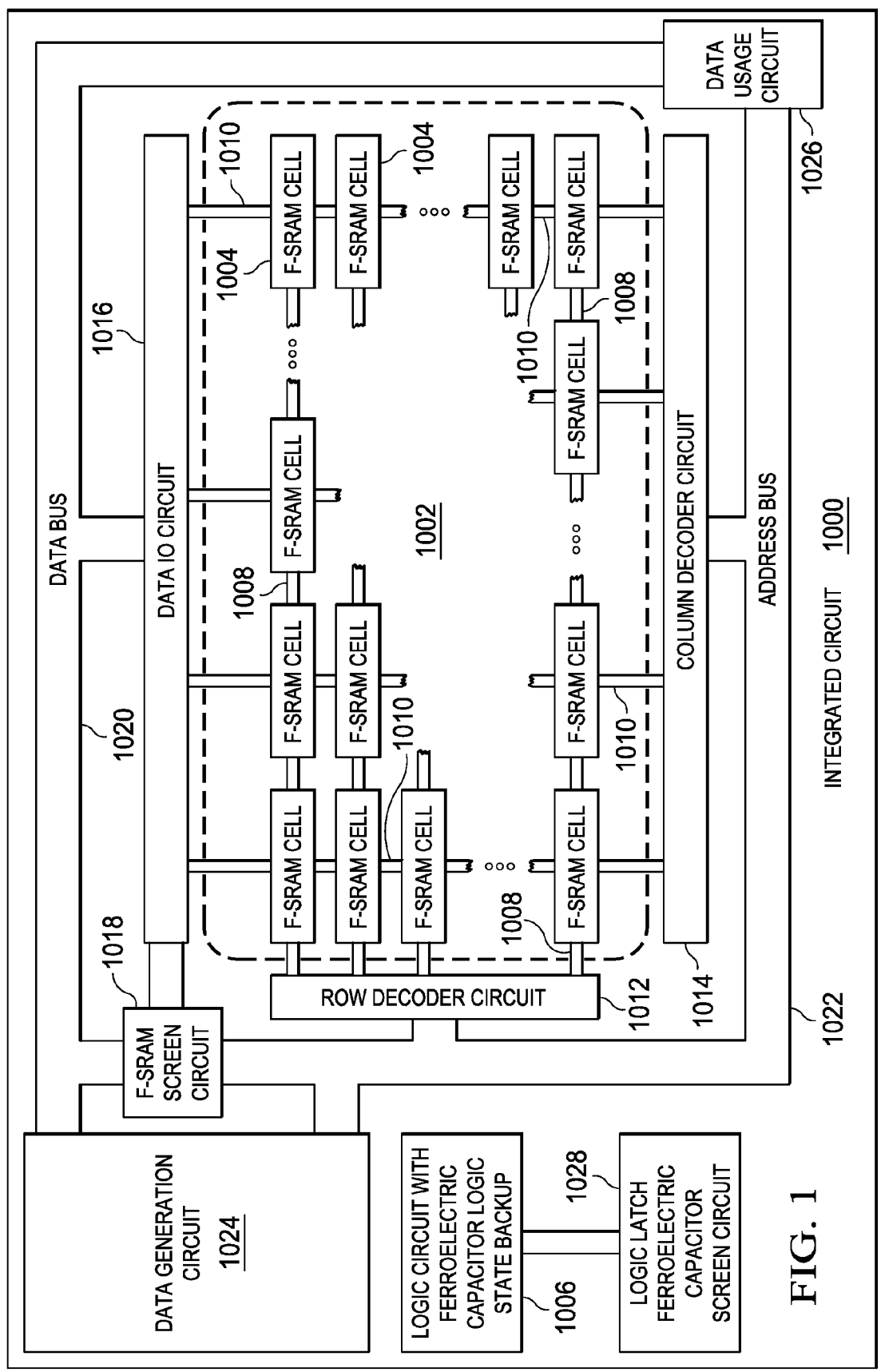
FIG. 1 is an integrated circuit containing programmable data storage components in the form of an F-SRAM array, and one or more logic circuits containing logic latches with ferroelectric capacitor backup.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may contain programmable data storage components with two complementary state nodes, such as static random access memory (SRAM) cells or logic latches. They can be programmed to store binary data or binary logic states and subsequently re-programmed with different binary values. The programmable data storage components may include two or more ferroelectric capacitors configured to provide non-volatile retention of the binary values, sometimes referred to as "backup".

Programmable data storage components may be screened for unreliable ferroelectric capacitors by applying a disturb voltage to one or both complementary state nodes prior to a recall operation on the ferroelectric capacitors. The disturb voltage application and recall process may be iterated so as to generate a quantitative parameter value which may be used to predict programmable data storage component reliability or to disposition devices containing programmable data storage components.

For the purposes of this disclosure, the term "Vdd" is understood to refer to a power supply node with a potential suitable for source nodes of p-channel metal oxide semiconductor (PMOS) transistors, and is commonly used to provide "power" for programmable data storage components. Similarly, the term "Vss" is understood to refer to a power supply node with a potential suitable for source nodes of n-channel metal oxide semiconductor (NMOS) transistors. Vss potential is lower than the Vdd potential, and is commonly used to provide a "ground" potential for programmable data storage components. The term "floated" is understood to mean disconnected from a voltage source such as Vdd or Vss, or connected to a voltage source through a high impedance path, for example a transistor, a resistor or a diode, so as to limit charge accumulation on a floated node.

The term "complementary state nodes" refers to state nodes in a data storage component which have opposite polarity voltages when power is applied to the data storage component.

The term "programming" is understood to refer to a process of polarizing ferroelectric capacitors in a programmable data storage component so as to provide data retention when power is removed from the programmable data storage component. The term "recall" is understood to refer to a process of biasing ferroelectric capacitors in a programmable data storage component which has been programmed so that the programmable data storage component returns to the programmed data state when power is reapplied to the programmable data storage component. The term "restore" is understood to refer to a process of re-polarizing ferroelectric capacitors in a programmable data storage component after a read operation, particularly a destructive read operation, so as to return the ferroelectric capacitors to the polarization configuration that existed immediately prior to the read operation.

Ferroelectric capacitors in a programmable data storage component may be described as data ferroelectric capacitors or load ferroelectric capacitors. Data ferroelectric capacitors are connected to plate nodes which are pulsed during recall operations. Load ferroelectric capacitors are connected to plate nodes which are statically biased during recall operations.

In some instances of integrated circuits containing programmable data storage components, substantially all circuits in the integrated circuit are dedicated to the operation of the programmable data storage components. In these instances, circuits which provide data to be stored in the programmable data storage components and circuits which use data from the programmable data storage components are located outside the integrated circuit containing the programmable data storage components. In other instances of integrated circuits containing programmable data storage component arrays, such as microprocessors, digital signal processors and wireless telephony controllers, the circuits which provide data to be stored in the programmable data storage components and the circuits which use data from the programmable data storage components are both located in the integrated circuit.

FIG. 1 is an integrated circuit (1000) containing programmable data storage components in the form of a ferroelectric SRAM ("F-SRAM") array (1002) of F-SRAM cells (1004) of a ferroelectric SRAM (F-SRAM) array (1002), and one or more logic circuits (1006) containing logic latches with ferroelectric capacitor backup. Each word line bus (1008) is coupled to F-SRAM cells (1004) in a row and may include more than one word line. Each bit line bus (1010) is coupled to F-SRAM cells (1004) in a column and may include one or more bit or bit-bar lines. A row decoder circuit (1012) applies appropriate biases to word lines in the word line buses (1008). A column decoder circuit (1014) applies appropriate biases to bit or bit-bar lines in the bit line buses (1010). A data input/output (IO) circuit (1016) reads data from the bit or bit-bar lines in the bit line buses (1010) during read operations and applies appropriate potentials to the bit or bit-bar lines in the bit line buses (1010) during single sided write operations. The integrated circuit further includes a data bus (1020) which carries data bits between the data IO circuit (1016) and circuits in the integrated circuit (1000), and an address bus (1022) which is used to select F-SRAM cells (1004) in the programmable data storage component array (1002) for read and write operations. The address bus (1022) is coupled to the row decoder circuit (1012), the column decoder circuit (1014) and an F-SRAM margin screen circuit (1018). The F-SRAM margin screen circuit (1018) applies signals and biases to the data IO circuit (1016) so as to apply a disturb voltage and perform a screening process. The F-SRAM margin screen circuit (1018) may also be coupled to the address bus (1022) and possibly to the data bus (1020). The integrated circuit (1000) may also contain a data generation circuit (1024) which connects to the data bus (1020) and address bus (1022). The data generation circuit (1024) produces incoming data bits for storage in the F-SRAM array (1002). The data bus (1020) carries the incoming data bits from the data generation circuit (1024) to the F-SRAM array (1002). The integrated circuit (1000) may also contain a data usage circuit (1026) which connects to the data bus (1020) and address bus (1022). The data usage circuit (1026) uses outgoing data bits which were stored in the F-SRAM array (1002). The data bus (1020) carries the outgoing data bits from the F-SRAM array (1002) to the data usage circuit (1026). The integrated circuit also includes a logic latch ferroelectric capacitor screen circuit (1028) coupled to the logic circuits (1006). The logic latch ferroelectric capacitor screen circuit (1028) applies a disturb voltage and performs a screening process on logic latches which include ferroelectric capacitor backup in the logic circuits (1006).

Figure 2:
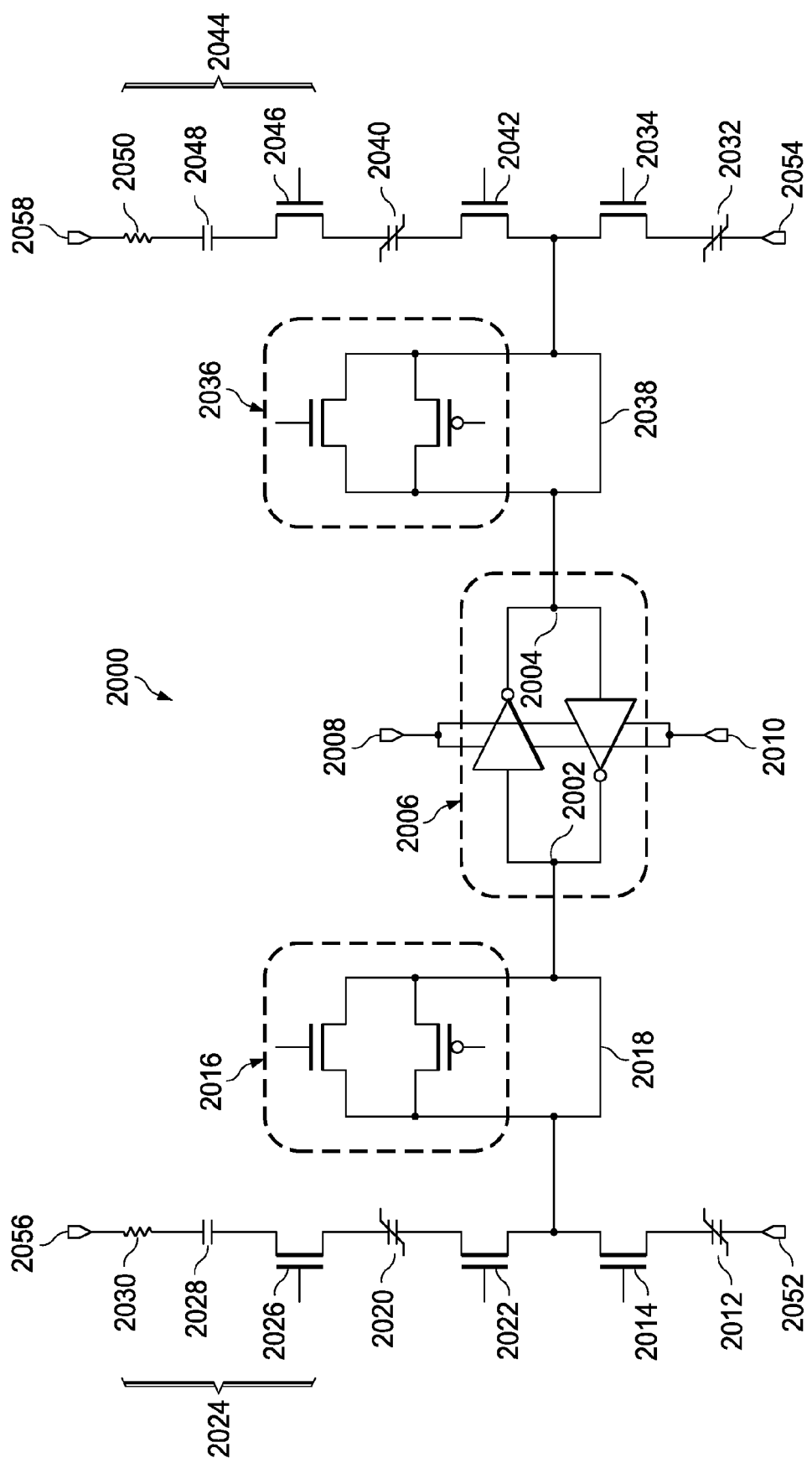
FIG. 2 is a circuit diagram of a programmable data storage component containing two complementary state nodes and at least two ferroelectric capacitors.

FIG. 2 is a circuit diagram of a programmable data storage component (2000) containing two complementary state nodes and at least two ferroelectric capacitors. The programmable data storage component (2000) may be the F-SRAM cell (1004) of the F-SRAM array (1002) shown in FIG. 1. Alternatively, the programmable data storage component (2000) may be a logic latch. A first state node (2002) and a second state node (2004) are complementary state nodes coupled by a state circuit (2006) which may be a pair of cross-coupled inverters as depicted in FIG. 2, or may be another realization of a circuit with two complementary state nodes. Vdd is applied to the state circuit (2006) through a Vdd node (2008), and Vss is applied to the state circuit (2006) through a Vss node (2010). The programmable data storage component (2000) contains a first data ferroelectric capacitor (2012) which is coupled to the first state node (2004), possibly through a first optional isolation transistor (2014), a first optional CMOS switch (2016) or a first optional direct connection (2018). In one realization of the instant embodiment, the programmable data storage component (2000) may contain an optional first auxiliary ferroelectric capacitor (2020), which may be a data ferroelectric capacitor or a load ferroelectric capacitor, coupled to the first state node (2002), possibly through a first optional load capacitor isolation transistor (2022). In another realization, the programmable data storage component (2000) may contain a first optional load (2024) coupled to the first data ferroelectric capacitor (2012), possibly including a first optional load transistor (2026), a first optional load capacitor (2028) or a first optional load resistor (2030).

The programmable data storage component (2000) may contain an optional second data ferroelectric capacitor (2032) coupled to the second state node (2004), possibly through a second optional isolation transistor (2034), a second optional CMOS switch (2036) or a second optional direct connection (2038). In one realization of the instant embodiment, the programmable data storage component (2000) may contain a second auxiliary ferroelectric capacitor (2040), which may be a data ferroelectric capacitor or a load ferroelectric capacitor, coupled to the second state node (2004), possibly through a second optional load capacitor isolation transistor (2042). In another realization, the programmable data storage component (2000) may contain a second optional load (2044) coupled to the second data ferroelectric capacitor (2032), possibly including a second optional load transistor (2046), a second optional load capacitor (2048) or a second optional load resistor (2050).

The first data ferroelectric capacitor (2012) may be polarized by applying a potential difference to the first state node (2002) and a first plate node (2052). The second data ferroelectric capacitor (2032) if present may be polarized by applying a potential difference to the second state node (2004) and a second plate node (2054). The first auxiliary ferroelectric capacitor (2020) if present may be polarized by applying a potential difference to the first state node (2002) and a first load plate node (2056). The second auxiliary ferroelectric capacitor (2040) if present may be polarized by applying a potential difference to the second state node (2004) and a second load plate node (2058).

The programmable data storage component (2000) includes the first data ferroelectric capacitor (2012) and at least one of the first auxiliary ferroelectric capacitor (2020), the second data ferroelectric capacitor (2032) and the second auxiliary ferroelectric capacitor (2040). Configuring the ferroelectric capacitors (2012, 2020, 2032, 2040) as described in reference to FIG. 2 may provide data retention when power is removed from the state circuit (2006). Other components which may be included in specific realizations of the programmable data storage component (2000), such as passgate transistors, bit data lines or word lines, are not shown in FIG. 2 for clarity.

Figure 3:
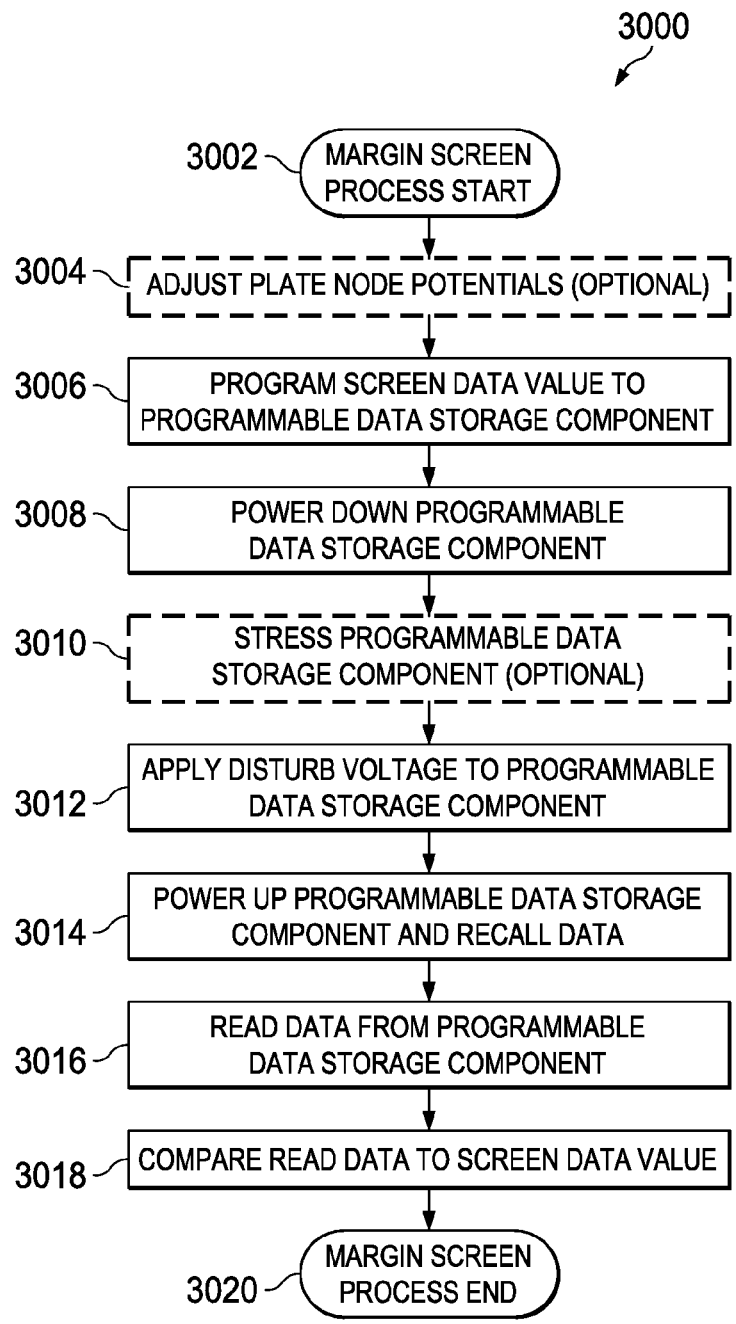
FIG. 3 is a flowchart of a margin screen process, as applied to a programmable data storage component such as depicted in FIG. 2.

FIG. 3 is a flowchart (3000) of a margin screen process, as applied to a programmable data storage component such as depicted in FIG. 2. The process begins (3002) with optional step (3004) which is to adjust a potential of the first plate node (2052), and the second plate node (2054) if present, the first load plate node (2056) if present and the second load plate node (2058) if present, from the typical operational potentials used prior to programming the programmable data storage component (2000). For example, a typical operational programming procedure may be to hold plate nodes (2052, 2054, 2056, 2058) at Vdd/2. In one realization of the instant embodiment, the potentials of the plate nodes (2052, 2054, 2056, 2058) may be adjusted so as to reduce a programming margin, for example by reducing voltage differences across the ferroelectric capacitors (2012, 2020, 2032, 2040) during a subsequent programming step.

Next, step (3006) is to program the programmable data storage component (2000) with a screening data value. In one realization of the instant embodiment, the screening data value may be a logical "one" bit value. In another realization, the screening data pattern may be a logical "zero" bit value. In realizations containing multiple programmable data storage components, patterns of screening data values may include solid "ones," solid "zeros," checkerboard patterns or more complicated patterns. An example programming sequence might be to write the screening data pattern into the programmable data storage components (2000) using typical write procedures, followed by cycling the potentials on the plate nodes (2052, 2054, 2056, 2058) from Vdd to Vss. Other programming sequences are within the scope of the instant embodiment. During the programming process of step (3006), potentials applied to the plate nodes (2052, 2054, 2056, 2058) may be adjusted from typical operational potentials used in programming the programmable data storage component (2000). For example, the plate node potentials may be adjusted so as to reduce a programming margin.

Next, step (3008) is to power down the programmable data storage component, in such a way as to preserve polarizations in the ferroelectric capacitors (2012, 2020, 2032, 2040). An example power down sequence might be to turnoff any passgate transistors and complementary passgate transistors if present (not shown in FIG. 2), bias the plate nodes (2052, 2054, 2056, 2058) to Vdd/2, reduce bias on the Vdd node (2008) from Vdd to Vss, and subsequently reduce the bias on the plate nodes (2052, 2054, 2056, 2058) to Vss. Other power down sequences are within the scope of the instant embodiment.

Subsequently, step (3010) may be executed, which is to optionally stress the ferroelectric capacitors (2012, 2020, 2032, 2040), for example by exposing the programmable data storage component to elevated temperatures. In one realization, the programmable data storage component may be held between 85° C. and 100° C., for 10 to 60 minutes. In another realization, the programmable data storage component may be held between 150° C. and 260° C., for 5 to 30 minutes.

Next, step (3012) is to apply a disturb voltage to the first state node (2002) or the second state node (2004) in the programmable data storage component (2000). The disturb voltage may be positive or negative, and should be limited in magnitude to less than Vdd/2. In one example, a disturb voltage may be limited to +/−25% of Vdd. The disturb voltage may be applied to the desired state node (2002, 2004) by biasing an appropriate data line and turning on an appropriate passgate transistor and possibly an appropriate complementary passgate transistor if present. The relevant passgate and complementary passgate transistors are turned off after the disturb voltage is applied.

Next, step (3014) is to execute a recall procedure through the ferroelectric capacitors (2012, 2020, 2032, 2040) and power up the programmable data storage component. An example recall and power up sequence might be to turn off any passgate transistors and complementary passgate transistors, bias the first load plate node (2056) and the second load plate node (2058) to Vss, subsequently cycle the first plate node (2052) and the second plate node (2054) from Vss to Vdd, and then bias the Vdd node (2008) to Vdd. Other recall and power up sequences are within the scope of the instant embodiment. In one realization of the instant embodiment, biases on the plate nodes (2052, 2054, 2056, 2058) and the Vdd node (2008) may be adjusted to reduce a recall margin. In a further realization, timing of biases and signals may be adjusted to reduce the recall margin.

Next, step (3016) is to read a data value from the programmable data storage component (2000). The data may be read using typical read procedures, for example by biasing the plate nodes (2052, 2054, 2056, 2058) at Vdd/2 and subsequently turning on any passgate transistors and complementary passgate transistors.

Next, step (3018) is to compare the data read value from the programmable data storage component (2000) to the screening data value. In particular, any difference between the read data value and the screening data value for the programmable data storage component is noted. After the read data value is compared to the screening data value, the margin screen process is ended (3020).

In one realization, the margin screen process may be repeated so that disturb voltages are applied to both the first state node (2002) and the second state node (2004) in separate iterations. Performing additional executions of the margin screen process which alternate state nodes may advantageously provide more useful information regarding the ferroelectric capacitors (2012, 2020, 2032, 2040).

In another realization, integrated circuits containing the programmable data storage component may be allocated for different purposes depending on any differences between the read data values and the screening data values. For example, integrated circuits with programmable data storage components exhibiting more than a prescribed number of differences may be withheld from commercial usage. In yet another realization, additional tests may be performed on programmable data storage components, possibly including repeated margin screen processes, depending on the differences between the read data values and the screening data values.

Figure 4:
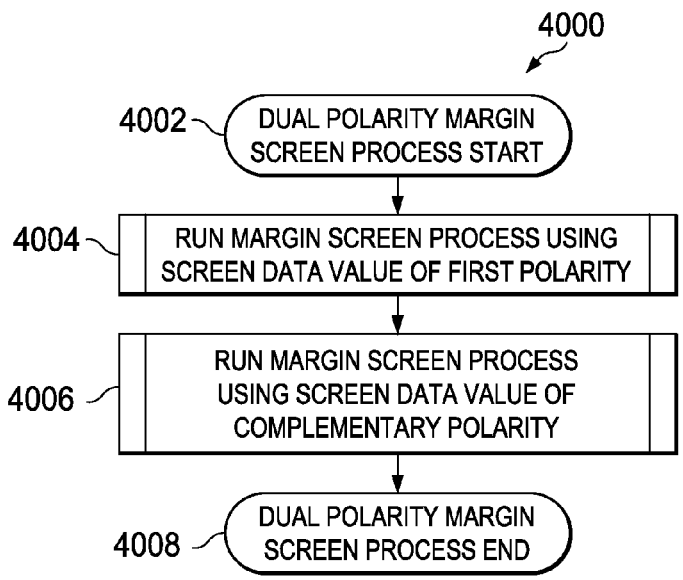
FIG. 4 is a flowchart of a dual polarity margin screen process.

FIG. 4 is a flowchart of a dual polarity margin screen process (4000), as applied to a programmable data storage component, such as the programmable data storage component (2000) depicted in FIG. 2. The process begins (4002) with step (4004) which is to run the margin screen process described in reference to FIG. 3 using a screening data value of a first polarity, for example a logical "one" bit value. Next, step (4006) is to run the margin screen process described in reference to FIG. 3 using a screening data value of a complementary polarity which is opposite from the first polarity used in step (4004), for example a logical "zero" bit value. After step (4006) is executed, the dual polarity margin screen process is ended (4008).

Figure 5:
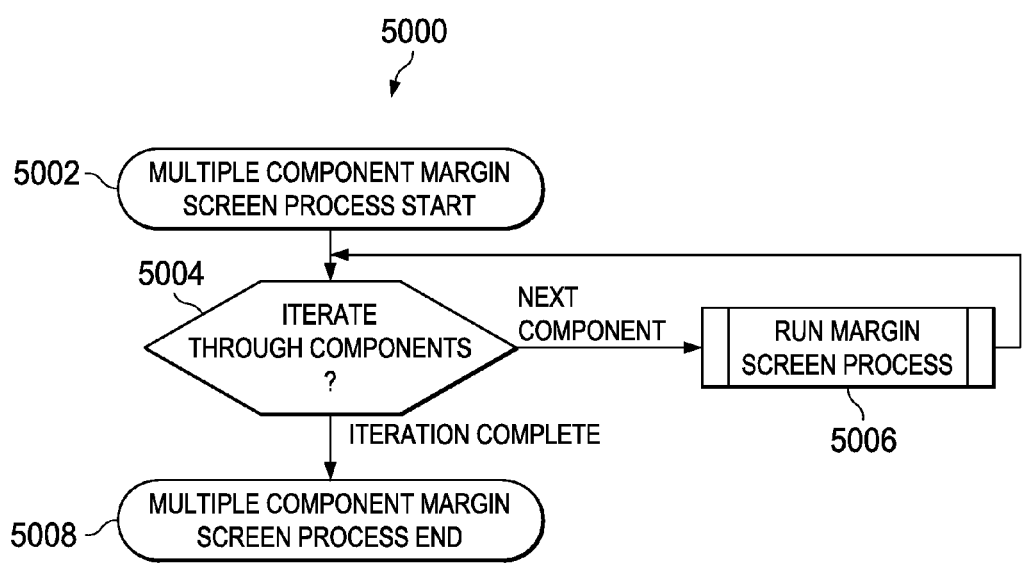
FIG. 5 is a flowchart of a multiple component margin screen process.

FIG. 5 is a flowchart of a multiple component margin screen process (5000), as applied to a programmable data storage component such as depicted in FIG. 2. The process begins (5002) with step (5004) which is to iterate through a set of programmable data storage components, for example F-SRAM cells in an F-SRAM array or logic latches in a logic circuit. In each iteration of step (5004), step (5006) is executed, which is to run the margin screen process described in reference to FIG. 3 on the programmable data storage component of the instant iteration. After iteration through the set of programmable data storage components is complete, the multiple component margin screen process is ended (5008).

Figure 6:
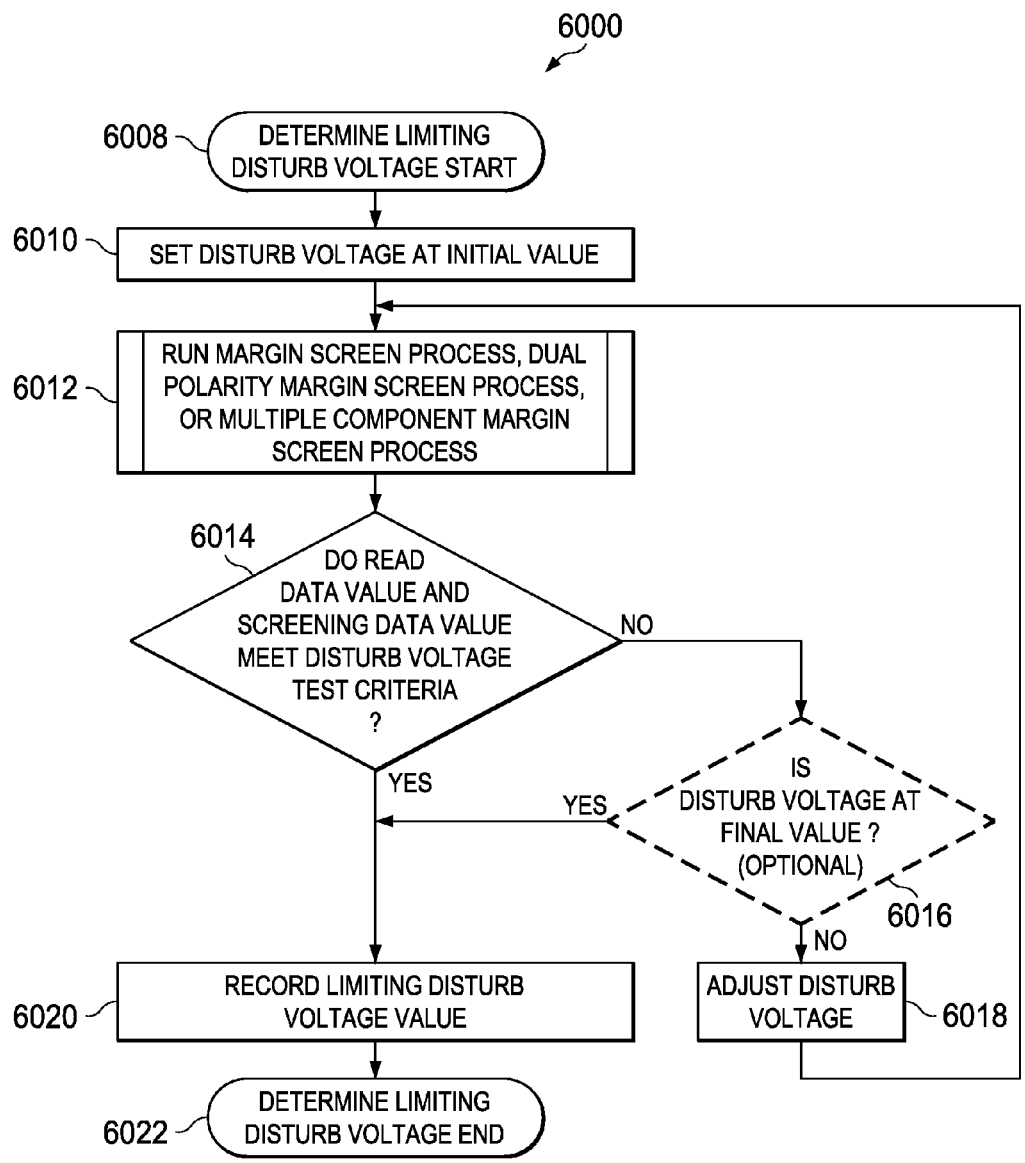
FIG. 6 is a flowchart of a process to determine a limiting disturb voltage.

The margin screen processes described in reference to FIG. 3 through FIG. 5 may be iterated to determine a limiting disturb voltage. The limiting disturb voltage may apply to a single programmable data storage component (2000) or a plurality of programmable data storage components (2000) such as F-SRAM cells in an F-SRAM array or logic latches in a logic circuit. FIG. 6 is a flowchart (6000) of a process to determine a limiting disturb voltage. The process begins (6008) with step (6010), to set a disturb voltage at an initial value on the first state node (2002) or the second state node (2004). For example, the initial disturb voltage value may be set at 100 millivolts. In an alternate realization of the instant embodiment, a complementary initial disturb voltage may be set for a complementary state node of the programmable data storage component (2000) being tested.

Next, step (6012) is to run the margin screen process described in reference to FIG. 3, or run the dual polarity margin screen process described in reference to FIG. 4, or run the multiple component margin screen process described in reference to FIG. 5, using the disturb voltage value, or values, set in step (6010). Differences between the read data values and the screening data values in step (3018) of FIG. 3 are noted for subsequent steps.

Next, decision step (6014) determines if the read data values and the screening data values meet one or possibly more criteria for determining the limiting disturb voltage. In a realization involving testing a single programmable data storage component, a criterion may be attaining a difference between the read data value and the screening data value. In a realization involving testing a plurality of programmable data storage components, a criterion may be attaining a prescribed number of differences between read data values and screening data values. In another realization involving testing an array of programmable data storage components, a criterion may be attaining a number of differences between read data values and screening data values which can be corrected by error correction code or repair mechanisms associated with the array of programmable data storage components.

If a result of decision step (6014) is no, then decision step (6016) may be executed, which is to optionally determine if a final value of the disturb voltage has been reached. In one realization of the instant embodiment, the final value of the disturb voltage may be a value deemed to predict a desired level of reliability in the programmable data storage component or array of programmable data storage components being tested.

If a result of decision step (6016), if executed, is no, or if the result of decision step (6014) is no and decision step (6016) is not executed, then step (6018) is executed, which is to adjust the value, or values, of the disturb voltage. In one realization of the instant embodiment, the value, or values, of the disturb voltage may be incremented to increase a difference between read data values and screening data values.

If the result of decision step (6014) is yes, or if the result of decision step (6016), if executed, is yes, then step (6020) is executed, which is to record a most recent value of the disturb voltage as the limiting value of the disturb voltage. After step (6020) is executed, the process to determine the limiting disturb voltage is ended (6022).

In one realization of the instant embodiment, integrated circuits containing the programmable data storage components may be allocated for different purposes depending on the limiting disturb voltage. For example, integrated circuits with programmable data storage components with values of the limiting disturb voltage beyond a prescribed value may be withheld from commercial usage. In another realization, additional tests may be performed on programmable data storage components depending on the limiting disturb voltage.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of testing an integrated circuit, comprising steps:
    providing a first programmable data storage component in said integrated circuit, said first programmable data storage component including:
        a first state node;
        a second state node coupled to said first state node by a state circuit, said second state node being complementary to said first state node;
        a first data ferroelectric capacitor coupled to said first state node; and
        a second data ferroelectric capacitor coupled to one of said first state node and said second state node;
    programming said first programmable data storage component with a first screening data value, such that said first data ferroelectric capacitor and said second data ferroelectric capacitor are polarized so as to provide data retention when power is removed from said first programmable data storage component;
    powering down said first programmable data storage component, so as to preserve polarizations in said first data ferroelectric capacitor and said second ferroelectric capacitor from said programming step;
    applying a disturb voltage to at least one of said first state node and said second state node;
    performing a recall and power up process on said first programmable data storage component;
    reading a first read data value from said first programmable data storage component; and
    comparing said first read data value to said first screening data value.

2. The process of claim 1, in which said first programmable data storage component is an F-SRAM cell.

3. The process of claim 1, in which said first programmable data storage component is a logic latch.

4. The process of claim 1, in which said second data ferroelectric capacitor is a data ferroelectric capacitor that is coupled to said second state node.

5. The process of claim 4, in which said first programmable data storage component further includes:
    a first auxiliary ferroelectric capacitor coupled to said first state node; and
    a second auxiliary ferroelectric capacitor coupled to said second state node.

6. The process of claim 1, in which said step of applying said disturb voltage is performed by applying said disturb voltage to said first state node and to said second state node.

7. The process of claim 1, further including a step of stressing said first data ferroelectric capacitor and said data second ferroelectric capacitor, said stressing step being performed after said programming step is completed and before said step of applying said disturb voltage.

8. The process of claim 7, in which said step of stressing said first data ferroelectric capacitor and said second data ferroelectric capacitor includes heating said integrated circuit between 85° C. and 100° C. for 10 to 60 minutes.

9. The process of claim 1, further including:
    programming said first programmable data storage component with a complementary screening data value, performed subsequent to said step of comparing said first read data value to said first screening data value, such that said complementary screening data value has an opposite binary value from said first screening data value;

powering down said first programmable data storage component;
applying said disturb voltage to at least one of said first state node and said second state node;
performing said recall and power up process on said first programmable data storage component;
reading a complementary read data value from said first programmable data storage component; and
comparing said complementary read data value from said read step to said complementary screening data value.

10. The process of claim 1, further including:
providing a second programmable data storage component in said integrated circuit, said second programmable data storage component including:
  a first state node;
  a second state node coupled to said first state node of said second programmable data storage component by a second state circuit, said second state node being complementary to said first state node of said second programmable data storage component;
  a first data ferroelectric capacitor coupled to said first state node of said second programmable data storage component; and
  a second data ferroelectric capacitor coupled to exactly one of said first state node of said second programmable data storage component and said second state node of said second programmable data storage component;
programming said second programmable data storage component with a second screening data value, such that said first data ferroelectric capacitor of said second programmable data storage component and said second data ferroelectric capacitor of said second programmable data storage component are polarized so as to provide data retention when power is removed from said second programmable data storage component;
powering down said second programmable data storage component, so as to preserve polarizations in said first data ferroelectric capacitor of said second programmable data storage component and said second data ferroelectric capacitor of said second programmable data storage component from said step of programming said second programmable data storage component;
applying said disturb voltage to at least one of said first state node of said second programmable data storage component and said second state node of said second programmable data storage component;
performing a recall and power up process on said second programmable data storage component;
reading a second read data value from said second programmable data storage component; and
comparing said second read data value to said second screening data value.

11. A process of testing an integrated circuit, comprising steps:
providing a first programmable data storage component in said integrated circuit, said first programmable data storage component including:
  a first state node;
  a second state node coupled to said first state node by a state circuit, said second state node being complementary to said first state node;
  a first data ferroelectric capacitor coupled to said first state node; and
  a second data ferroelectric capacitor coupled to one of said first state node and said second state node;
setting a disturb voltage at an initial value;
programming said first programmable data storage component with a first screening data value, such that said first data ferroelectric capacitor and said second data ferroelectric capacitor are polarized so as to provide data retention when power is removed from said first programmable data storage component;
powering down said first programmable data storage component, so as to preserve polarizations in said first data ferroelectric capacitor and said second data ferroelectric capacitor from said step of programming said first programmable data storage component;
applying said disturb voltage to at least one of said first state node and said second state node;
performing a recall and power up process on said first programmable data storage component;
reading a first read data value from said first programmable data storage component;
comparing said first read data value to said first screening data value;
determining if said first screening data value and said first read data value meet a criterion for determining a limiting disturb voltage value;
adjusting a value of said disturb voltage; and
repeating said steps of:
  programming said programmable data storage component with said first screening data value;
  powering down said programmable data storage component;
  applying said adjusted disturb voltage to at least one of said first state node and said second state node;
  performing said recall and power up process on said first programmable data storage component;
  reading a first iterative read data value from said programmable data storage component; and
  comparing said first iterative read data value to said first screening data value; and
  determining if said first iterative read data value and said first screening data value meet said criterion for determining said limiting disturb voltage value.

12. The process of claim 11, in which said first programmable data storage component is an F-SRAM cell.

13. The process of claim 11, in which said first programmable data storage component is a logic latch.

14. The process of claim 11, in which said second data ferroelectric capacitor is a data ferroelectric capacitor that is coupled to said second state node.

15. The process of claim 14, in which said first programmable data storage component further includes:
a first auxiliary ferroelectric capacitor coupled to said first state node; and
a second auxiliary ferroelectric capacitor coupled to said second state node.

16. The process of claim 11, in which:
said step of applying said disturb voltage is performed by applying said disturb voltage to said first state node and to said second state node; and
said step of applying said adjusted disturb voltage is performed by applying said adjusted disturb voltage to said first state node and to said second state node.

17. The process of claim 11, further including a step of stressing said first data ferroelectric capacitor and said second data ferroelectric capacitor, said stressing step being performed after said programming step is completed and before said step of applying said disturb voltage is started.

18. The process of claim 17, in which said step of stressing said first data ferroelectric capacitor and said second data ferroelectric capacitor includes heating said integrated circuit between 85° C. and 100° C. for 10 to 60 minutes.

19. The process of claim 11, further including:
programming said first programmable data storage component with a first complementary screening data value, such that said first complementary screening data value has an opposite binary value from said first screening data value, after said step of comparing said first read data value to said first screening data value;
powering down said first programmable data storage component after said step of programming said first programmable data storage component with a first complementary screening data value;
applying said disturb voltage to at least one of said first state node and said second state node after said step of powering down said first programmable data storage component;
performing said recall and power up process on said first programmable data storage component after said step of applying said disturb voltage to at least one of said first state node and said second state node;
reading a first complementary read data value from said first programmable data storage component after said step of performing said recall and power up process on said first programmable data storage component;
comparing said first complementary read data value from said read step to said complementary screening data value after said step of reading a first complementary read data value from said first programmable data storage component;
programming said first programmable data storage component with said first complementary screening data value, such that said first complementary iterative screening data value has an opposite binary value from said first screening data value after said step of comparing said first iterative read data value to said first iterative screening data value;
powering down said first programmable data storage component after said step of programming said first programmable data storage component with said first complementary screening data value;
applying said disturb voltage to at least one of said first state node and said second state node after said step of powering down said first programmable data storage component;
performing said recall and power up process on said first programmable data storage component after said step of applying said disturb voltage to at least one of said first state node and said second state node;
reading a first complementary iterative read data value from said first programmable data storage component after said step of performing said recall and power up process on said first programmable data storage component; and
comparing said first complementary iterative read data value from said read step to said first complementary screening data value after said step of reading a first complementary iterative read data value from said first programmable data storage component.

20. The process of claim 11, further including:
providing a second programmable data storage component in said integrated circuit, said second programmable data storage component including:
a first state node;
a second state node coupled to said first state node of said second programmable data storage component by a second state circuit, said second state node being complementary to said first state node of said second programmable data storage component;
a first data ferroelectric capacitor coupled to said first state node of said second programmable data storage component; and
a second data ferroelectric capacitor coupled to exactly one of said first state node of said second programmable data storage component and said second state node of said second programmable data storage component;
programming said second programmable data storage component with a second screening data value, such that said first data ferroelectric capacitor of said second programmable data storage component and said second data ferroelectric capacitor of said second programmable data storage component are polarized so as to provide data retention when power is removed from said second programmable data storage component;
powering down said second programmable data storage component, so as to preserve polarizations in said first data ferroelectric capacitor of said second programmable data storage component and said second data ferroelectric capacitor of said second programmable data storage component from said step of programming said second programmable data storage component;
applying said disturb voltage to at least one of said first state node of said second programmable data storage component and said second state node of said second programmable data storage component;
performing a recall and power up process on said second programmable data storage component;
reading a second read data value from said second programmable data storage component; and
comparing said second read data value to said second screening data value;
determining if said second screening data value and said second read data value meet a criterion for determining a limiting disturb voltage value;
repeating said steps of:
programming said second programmable data storage component with said second screening data value;
powering down said second programmable data storage component;
applying said adjusted disturb voltage to at least one of said first state node of said second programmable data storage component and said second state node of said second programmable data storage component;
performing said recall and power up process on said second programmable data storage component;
reading a second iterative read data value from said programmable data storage component; and
comparing said second iterative read data value to said second screening data value; and
determining if said second iterative read data value and said second screening data value meet said criterion for determining said limiting disturb voltage value.

* * * * *